United States Patent [19]

Carlson

[11] 4,166,919
[45] Sep. 4, 1979

[54] AMORPHOUS SILICON SOLAR CELL ALLOWING INFRARED TRANSMISSION

[75] Inventor: David E. Carlson, Yardley, Pa.
[73] Assignee: RCA Corporation, New York, N.Y.
[21] Appl. No.: 945,602
[22] Filed: Sep. 25, 1978
[51] Int. Cl.² ............................................. H01L 31/06
[52] U.S. Cl. .......................... 136/89 CL; 136/89 TF; 357/2; 357/30
[58] Field of Search ........ 136/89 CC, 89 CA, 89 CL, 136/89 TF, 89 SJ; 357/2, 30

[56] References Cited
U.S. PATENT DOCUMENTS

| | | | |
|---|---|---|---|
| 3,076,861 | 2/1963 | Samulon et al. | 136/89 |
| 3,247,392 | 4/1966 | Thelen | 250/226 |
| 3,743,847 | 7/1973 | Boland | 250/510 |
| 3,888,698 | 6/1975 | Lindmayer et al. | 136/89 |
| 3,907,595 | 9/1975 | Lindmayer | 136/89 |
| 3,973,994 | 8/1976 | Redfield | 136/89 |
| 3,981,293 | 9/1976 | Gillery | 126/271 |
| 3,988,167 | 10/1976 | Kressel | 136/89 |
| 4,064,521 | 12/1977 | Carlson | 357/2 |
| 4,096,387 | 6/1978 | Buckley | 250/372 |
| 4,109,271 | 8/1978 | Pankove | 357/30 |
| 4,126,150 | 11/1978 | Bell et al. | 136/89 TF |

FOREIGN PATENT DOCUMENTS 1455903 11/1976 United Kingdom .
230993 5/1969 U.S.S.R. .
389579 11/1973 U.S.S.R. .

OTHER PUBLICATIONS

MacLeod, "Thin-Film Optical Filters," American Elsevier Pub. Co., (1969), pp. 94–110.

Primary Examiner—Aaron Weisstuch
Attorney, Agent, or Firm—Birgit E. Morris; A. Stephen Zavell

[57] ABSTRACT

An amorphous silicon solar cell with a layer of high index of refraction material or a series of layers having high and low indices of refraction material deposited upon a transparent substrate to reflect light of energies greater than the bandgap energy of the amorphous silicon back into the solar cell and transmit solar radiation having an energy less than the bandgap energy of the amorphous silicon.

14 Claims, 3 Drawing Figures

AMORPHOUS SILICON SOLAR CELL ALLOWING INFRARED TRANSMISSION

The invention described herein was made during the performance of work under an Energy Research And Development Adminstration Contract, (ERDA), presently the Department of Energy, No. EY-76-C-03-1286.

BACKGROUND OF THE INVENTION

This invention relates to photovoltaic devices, commonly known as solar cells, capable of converting solar radiation into useable electrical energy. More specifically, this invention relates to amorphous silicon solar cells.

The photovoltage, photocurrent, and lifetime of solar cells and especially amorphous silicon solar cells tends to decrease with increasing cell temperature. Solar radiation having an energy less than the bandgap energy of the semiconductor material which is absorbed by the solar cell tends to raise the temperature of the solar cell and lowers the electrical output and lifetime of the cell. Typically, infrared radiation, i.e., light having a wavelength longer than about 0.80 micrometers ($\mu$m) has an energy which is less than the bandgap energy of amorphous silicon. Absorption of the infrared radiation by the solar cell degrades the performance and shortens the useful life of the solar cell.

U.S. Pat. No. 3,888,698 to Lindmayer et al describes a solar cell with a transparent back electrode which permits radiation of less than the bandgap energy, i.e., infrared radiation, to pass through the cell without absorption and heating of the device. Lindmayer et al's solution is acceptable for single crystalline silicon or other semiconductor materials where the active region of the solar cell can be made thick enough to absorb all of the light with energies greater than the bandgap energy of the semiconductor material. However, with amorphous silicon, the minority carrier lifetime is significantly less than in single crystalline silicon and the devices are sufficiently thin so that a portion of the light having an energy greater than the bandgap energy of the amorphous silicon can pass out of the solar cell along with the infrared radiation. Thus, it would be highly desirable to have a device which is transmissive to infrared radiation but reflects back into the active region of the cell solar radiation having an energy which is greater than the bandgap energy of the active region of amorphous silicon.

SUMMARY OF THE INVENTION

An amorphous silicon solar cell which is transmissive to solar radiation of energy less than the bandgap energy of the active region of amorphous silicon. The solar cell incorporates a layer of material with a high index of refraction and a bandgap equal to or greater than the bandgap of the active region or a series of alternating layers of high index of refraction and low index of refraction materials which are transmissive to solar radiation not absorbed by the solar cell and reflect back into the cell solar radiation having an energy greater than the bandgap energy of the amorphous silicon. Transmitting the infrared radiation through the solar cell structure permits the cell to operate at a lower temperature with a resultant increase in lifetime of the device.

DETAILED DESCRIPTION OF THE INVENTION

Figure 1:
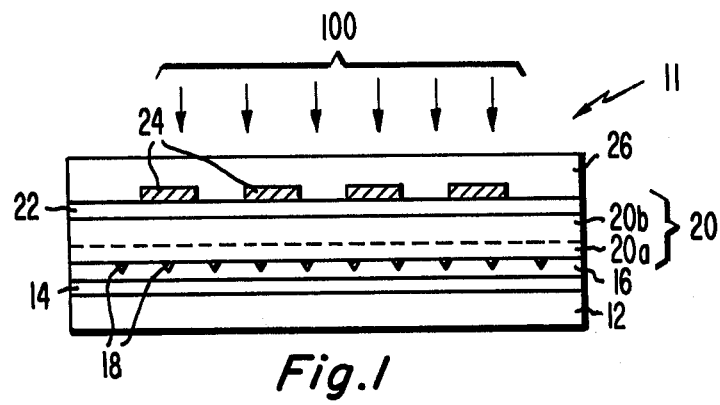
FIG. 1 is a cross-sectional view of a first embodiment of the present invention.

The invention will be more clearly described by referring to FIG. 1 wherein a first embodiment of the present invention is designated as 11, hereinafter solar cell 11.

For the purposes of illustrating the present invention, solar cell 11 will be described as a Schottky barrier solar cell. However, I wish it to be understood that my invention is equally applicable to a PN junction solar cell, a PIN solar cell, a Schottky barrier solar cell incorporating an insulating layer and Schottky barrier solar cell incorporating a thin highly doped P+ region adjacent to the Schottky barrier metal, and like solar cell structure.

Solar cell 11 is fabricated on a transparent substrate 12. The substrate 12 can be any material which is transparent to solar radiation in the infrared portion of the spectrum, i.e., above about 0.080 $\mu$m, such as $Al_2O_3$, $SiO_2$, quartz, borosilicate glasses, and the like. Deposited upon the transparent substrate 12 is a layer 14 of material having a high index of refraction, i.e., greater than about 2.5 such as intrinsic amorphous silicon with a sufficiently high hydrogen content to assure a small absorption coefficient at wavelengths longer than about 0.65 $\mu$m. The amorphous silicon is fabricated by a glow discharge in silane or other suitable silicon-hydrogen containing atmospheres. Since the hydrogen content of the amorphous silicon decreases with increasing temperature, the substrate 12 should be maintained at a temperature of from about room temperature, i.e., about 25° C., to about 300° C. during the deposition of layer 14. Alternatively, a high hydrogen content in the amorphous silicon layer can be assured by using a high power glow discharge system and a low pressure. Optionally and not shown in FIG. 1, layer 14 can be deposited on the opposite side of substrate 12 or on both sides of substrate 12.

Deposited on the high refractive index layer 14 is back contact 16 of a suitable material such as indium tin oxide, tin oxide and like materials. Layer 16 should be as thin as possible so that it transmits the maximum amount of infrared radiation passing through the active region 20. Preferably, the back electrode has a resistivity of 10 $\Omega/\square$ or less. If the solar cell is sufficiently large, i.e., an area greater than about 0.1 cm$^2$, then grid electrodes 18 of a suitable material such as aluminum, gold or silver are fabricated by suitable photolithographic or screen-printing techniques on or into layer 16 to withdraw the current generated during the operation of the solar cell.

Deposited on the back contact 16 is a body 20 of amorphous silicon fabricated by a glow discharge in silane or other suitable reactant gases as taught by U.S. Pat. No. 4,064,521 incorporated herein by reference, and application Ser. No. 727,659, filed Sept. 29, 1976, incorporated herein by reference. The body is composed of a region 20a of N+-type conductivity which forms a better ohmic contact to the back electrode 16 and electrode grid 18 than does region 20b of intrinsic amorphous silicon. Region 20a may be doped with suitable N-type conductivity modifiers such as phosphine or arsine and materials such as antimony, bismuth, cesium nitride and sodium hydroxide or other suitable N-type dopants. Region 20a is from about 0.10 to about 0.40 μm thick and preferably about 0.20 μm thick. After the region 20a of N+-type amorphous silicon is deposited, the doping gas is pumped out of the system and the deposition is continued in silane or another suitable silicon-hydrogen containing compounds to deposit region 20b of intrinsic hydrogenated amorphous silicon. The intrinsic region is from about 0.20 to about 1.0 μm thick and preferably about 0.30 μm thick.

A Schottky barrier layer 22 is deposited on the incident surface of the body of amorphous silicon 20. The Schottky barrier 22 is at least semitransparent to solar radiation and is of a metallic material with good electrical conductivity and is of a high work function, i.e., 4.5 eV or greater, such as gold, palladium, platinum, iridium, rhodium, high work function metal cermets, and like materials. The layer 22 is from about 50 to about 400 angstroms thick. A metallic collection grid 24 of aluminum, gold or other suitable metals is deposited on the Schottky barrier 22 by evaporation or other suitable means. If the solar cell is less than about 0.1 cm² in area then the current can be withdrawn through an integral conducting antireflection layer 26, such as tin oxide, indium tin oxide, cadmium stannate, gallium nitride and like materials. When the antireflection layer doubles as the incident electrode, the sheet resistivity of layer 26 should be less than about 10 Ω/□ to withdraw the current generated during operation of solar cell 11. When a grid electrode forms an integral part of the solar cell 11, the antireflection layer 26 is not limited to conductive coatings. Titanium oxide (TiO₂), zirconium oxide (ZrO₂), and like materials are also suitable antireflection coatings.

The thickness of the antireflection coating can be approximately determined according to the formula $$\lambda/4n$$

where n is the index of refraction of the antireflection layer 26 and λ is the wavelength of radiation impinging on the surface of solar cell 11. Typically, the thickness of a ZrO₂ antireflection coating on a platinum Schottky barrier is about 0.045 μm in thickness.

Solar radiation 100 impinging on the incident surface of the solar cell is absorbed and generates electron-hole pairs therein. The electrons and holes are separated by a built-in electric field created by the Schottky barrier. The electrons generated in the Schottky barrier semiconductor body junction flow towards the semiconductor body wherein the electrons are collected. Solar radiation having a wavelength less than the bandgap of the semiconductor body passes through the high index of refraction layer 14 out of the cell without heating the solar cell and thus lowering the electrical output. The high index of refraction layer 14 reflects back into the solar cell light of wavelengths below the infrared region to be absorbed by the active region and increase the electrical output of the solar cell.

Figure 2:
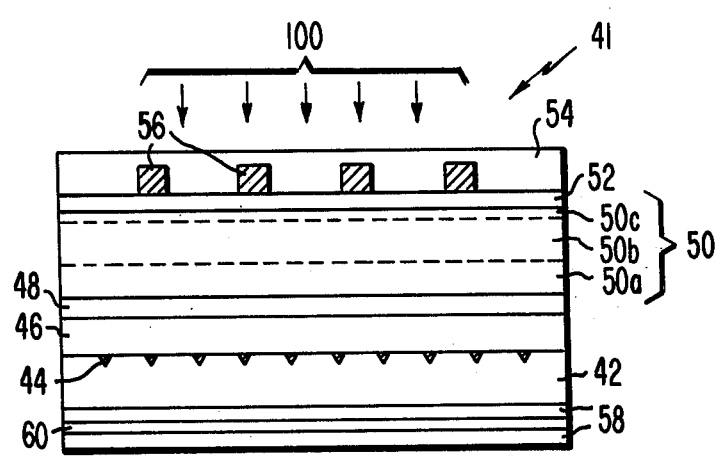
FIG. 2 is a cross-sectional view of a second embodiment of the present invention.

An alternative embodiment is illustrated by solar cell 41 in FIG. 2. For purposes of illustration the solar cell 41 will be described as a Schottky barrier solar cell with a thin P+doped region between the Schottky barrier and the intrinsic amorphous silicon. As indicated previously, the embodiment of the invention illustrated by FIG. 2 is not limited solely to Schottky barrier solar cells.

Solar cell 41 includes a substrate 42 of glass, SiO₂, sapphire, and like materials with indices of refraction about 1.5 which are transparent to infrared radiation. If the size of the solar cell is sufficiently large, a grid electrode structure 44 is deposited on substrate 42 and contacts the transparent back electrode 46 to withdraw current generated during the operation of the cell. The transparent back electrode 46 is from about 0.15 to about 0.30 and preferably 0.25 μm thick. The electrode is deposited on the substrate 42 by known methods such as vacuum evaporation of indium tin oxide and like materials. Optionally, a cermet layer 48 about 0.01 μm of Ni-SiO₂, Nb-SiO₂ or like materials is deposited on the transparent electrode 46 to form a better ohmic contact to the body 50 of amorphous silicon.

A body 50 of amorphous silicon having a region of N+-type conductivity 50a, a region of intrinsic amorphous silicon 50b and a region of P+conductivity 50c is deposited on the transparent back electrode 46 by a glow discharge in accordance with the previously mentioned patent and application of David E. Carlson. Regions 50a and 50b are similar to regions 20a and 20b in FIG. 1. The P+-type region 50c incorporates a suitable P-type conductivity modifier such as boron, aluminum and other suitable P-type dopants and has a thickness of from about 50 to about 300 angstroms, preferably about 0.02 μm.

A Schottky barrier layer 52 is deposited, by methods known in the art, such as evaporation, on the body 50. Layer 52 has a thickness of from about 0.005 to about 0.01 μm. A layer 54 of a material such as indium tin oxide with a sheet resistivity of about 10 Ω/□ and transparent to solar radiation is deposited on layer 52. If the solar cell area is large enough, i.e., greater than 0.1 cm², then a grid electrode 56 can be deposited on the Schottky barrier 52 after the deposition of layer 54. If the antireflection layer 54 is an insulator then the grid electrode 56 must be deposited on the Schottky barrier 52 before the deposition of layer 54.

Alternating layers of high refraction index material 58 and low index refraction material 60 are deposited on the surface of the glass substrate 42 opposite the surface upon which the solar cell structure 41 is fabricated. For each layer of low index of refraction material, M, there should be M+1 layers of high index of refraction material. The total number of layers M is only limited to an overall thickness of the M and M+1 layers which will remain transparent to infrared radiation. Although FIG. 2 illustrates a solar cell where M is equal to 1, M can vary from about 1 to about 10 or more with the above proviso of being transparent to infrared radiation.

Materials such as PbCl₂, TiO₂, ZnS, amorphous silicon with a high hydrogen content and like materials having a high index of refraction and transparent to solar radiation are suitable for layer 58. The low index of refraction, i.e., an index of refraction less than about 2.0, layer 60 can be fabricated from material such as Na₃AlF₆, MgF₂, SiO₂, and like materials. Both layers 58 and 60 must also be transparent to solar radiation in the infrared portion of the spectrum. The thickness of the alternating layers is selected so that solar radiation less than about 0.80 μm is reflected back into the cell structure through the glass substrate 42 and solar radiation with a wavelength greater than 0.80 μm passes out of the cell. Alternatively, a single layer of high refractive index materials such as amorphous silicon can be deposited on glass substrate 42. For example, if said layer has a thickness of about 0.1625 μm, more than about 75% of the radiation at 0.65 μm will be reflected back into the cell and the maximum transmission will occur at about 1.14 μm.

Figure 3:
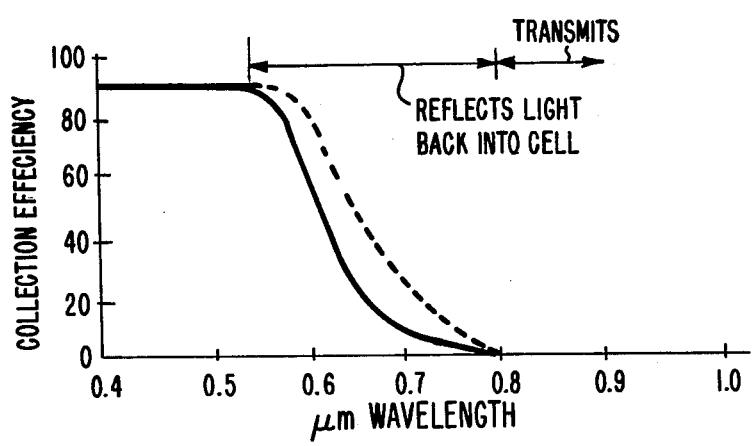
FIG. 3 illustrates a graph of the improved collection efficiency of a solar cell incorporating the embodiments of FIG. 2.

The thickness of the laternating high and low refractive index coatings are determined in accordance with the teachings of "Thin-Film Optical Filters" by MacLeod, American Elsevier Publishing Company, Inc., pp. 94–110 (1969). A range over which the high and low index of refraction layers will reflect back light having a given wavelength is determined by the plot of the collection efficiency vs. wavelength as depicted in FIG. 3. The collection efficiency rapidly falls off at wavelengths above about 0.55 μm. However, light of wavelengths up to about 0.80 μm can be absorbed by the cell to produce electricity. Thus, the high and low index of refraction layers are designed to reflect back light below a predetermined wavelength and transmit light above a given wavelength. If 0.78 μm is selected as a predetermined wavelength then according to the formula $$G = \frac{2}{\pi} \sin^{-1}\left(\frac{n_H - n_L}{n_H + n_L}\right)$$

where G is the width of the zone of reflectance and $n_H$ and $n_L$ are the high and low indices of refraction of the layers 58 and 60 respectively. If for example, $n_H$ is ZnS with an index of refraction of 2.35 and $n_L$ has an index of refraction of 1.38 such as $MgF_2$ then layers 58 and 60 will reflect back into the cell light of wavelengths between about 0.552 μm and 0.780 μm. Light with a wavelength greater than about 0.780 μm will be transmitted through solar cell 41. The thickness of layers 58 and 60 is determined by the formula Layer thickness $\simeq \lambda_o/4$ where $\lambda_o$ is the center of the region of reflectance. For the above example where the central point of the region of reflectance is about 0.650 μm, layers 58 and 60 are about 0.1625 μm thick.

The layers 58 and 60 reflect back into the cell light between the wavelengths of about 0.560 μm and 0.780 μm which increases the collection efficiency as illustrated by the dashed line in FIG. 3. Infrared radiation above 0.780 μm is transmitted through the cell without being absorbed.

FIGS. 1 and 2 illustrate suitable examples of solar cells in accordance with the teachings of my invention. However, it is not my invention to limit my invention solely to the examples illustrated above. I intend to include within the scope of my invention such modifications as would be obvious to the ordinary worker skilled in the art of designing and fabricating solar cells.

I claim:

1. In an amorphous silicon solar cell comprising a transparent substrate having a major surface incident to solar radiation and a major surface opposite to said incident surface, a first transparent electrode deposited on said substrate, an active region of amorphous silicon having regions of differing conductivity, fabricated by a glow discharge in a silicon-hydrogen containing atmosphere, deposited on said first transparent electrode, means for defining a rectifying junction within or at the surface of said active region, a second transparent electrode deposited over said rectifying junction, and an antireflection layer deposited on said second electrode wherein the improvement comprises at least one layer of a transparent material having an index of refraction greater than about 2.5 contacting at least one of said major surfaces of said transparent substrate.

2. The solar cell according to claim 1 wherein said layer of transparent material contacts both of said major surfaces of said transparent substrate.

3. The solar cell according to claim 1 wherein said layer of transparent material contacts said transparent substrate opposite to the surface of said substrate contacting said first transparent electrode.

4. The solar cell according to claim 1 wherein said layer of transparent material contacts said first transparent electrode and said transparent substrate.

5. The solar cell according to claim 4 wherein said layer of transparent material is of a thickness which reflects light having a wavelength below about 0.78 micrometers back into the cell and transmits light of wavelengths greater than 0.78 micrometers.

6. The solar cell according to claim 4 wherein said layer of transparent material is selected from the group consisting of amorphous silicon, CdS, $Sb_2S_3$, and ZnSe.

7. The solar cell according to claim 6 wherein said layer of transparent material is amorphous silicon fabricated by a glow discharge in a silicon-hydrogen containing atmosphere at a substrate temperature of from about 25° C. to about 300° C.

8. The solar cell according to claim 6 wherein said layer of transparent material has a bandgap energy greater than or equal to the bandgap energy of said active region of amorphous silicon.

9. The solar cell according to claim 1 further comprising M alternating layers of a transparent material having an index of refraction less than about 2.0 and M+1 layers of said transparent material having an index of refraction greater than about 2.5.

10. The solar cell according to claim 9 wherein said alternating layer of high and low index of refraction transparent material contact said major transparent substrate surface opposite said major incident surface.

11. The solar cell according to claim 9 wherein said alternating layers of transparent materials reflect light having a wavelength below about 0.78 micrometers and transmit light having wavelengths above 0.78 micrometers.

12. The solar cell according to claim 9 wherein M is from 1 to 10.

13. The solar cell according to claim 12 wherein said transparent material having an index of refraction greater than about 2.5 is selected from the group consisting of amorphous silicon, CdS, $Sb_2S_3$, ZnSe, $PbCl_2$, and $TiO_2$.

14. The solar cell according to claim 13 wherein said material having an index of refraction less than about 2.0 is selected from the group consisting of $MgF_2$, $Na_3AlF_6$, and $SiO_2$.

* * * * *